United States Patent
Yang

(10) Patent No.: US 12,150,357 B2
(45) Date of Patent: Nov. 19, 2024

(54) DISPLAY PANEL HAVING METAL LINES WITH DIFFERENT RESISTIVITIES AND DISPLAY DEVICE

(71) Applicant: Wuhan China Star Optoelectronics Semiconductor Display Technology Co., Ltd., Wuhan (CN)

(72) Inventor: Weiwei Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/979,881

(22) PCT Filed: Jun. 24, 2020

(86) PCT No.: PCT/CN2020/098248
§ 371 (c)(1),
(2) Date: Sep. 11, 2020

(87) PCT Pub. No.: WO2021/237859
PCT Pub. Date: Dec. 2, 2021

(65) Prior Publication Data
US 2023/0200168 A1    Jun. 22, 2023

(30) Foreign Application Priority Data
May 26, 2020  (CN) .......................... 202010455905.3

(51) Int. Cl.
*H10K 59/131*    (2023.01)
*H10K 59/122*    (2023.01)

(52) U.S. Cl.
CPC ....... *H10K 59/1315* (2023.02); *H10K 59/122* (2023.02)

(58) Field of Classification Search
CPC ............. H10K 59/1315; H10K 59/122; H10K 59/124; H10K 59/131
See application file for complete search history.

(56) References Cited

U.S. PATENT DOCUMENTS

2012/0313905 A1* 12/2012 Kang ..................... G02F 1/1345
445/24
2018/0182291 A1*  6/2018 Hanari ................. H10K 59/131
(Continued)

FOREIGN PATENT DOCUMENTS

| CN | 1743927 A | 3/2006 |
|---|---|---|
| CN | 102819995 A | 12/2012 |

(Continued)

*Primary Examiner* — Nduka E Ojeh
(74) *Attorney, Agent, or Firm* — Nathan & Associates; Menachem Nathan

(57) ABSTRACT

The present invention provides a display panel and a display device. The display panel includes a first fan-out region, a bonding region disposed on a side of the first fan-out region, a second fan-out region disposed on a side of the bonding region away from the first fan-out region, a plurality of first metal lines, a plurality of second metal lines, wherein a resistivity of the second metal lines is less than a resistivity of the first metal lines, and a plurality of connecting lines, wherein one end of each of the connecting lines is connected to the first metal line, and the other end of each of the connecting lines is connected to the second metal lines.

8 Claims, 2 Drawing Sheets

(56) References Cited

U.S. PATENT DOCUMENTS

| | | | | |
|---|---|---|---|---|
| 2019/0164998 A1* | 5/2019 | Cho | .................... | H10K 50/844 |
| 2020/0310493 A1* | 10/2020 | Kim | .................... | H10K 59/124 |
| 2021/0066441 A1* | 3/2021 | Jung | .................... | H10K 59/131 |
| 2021/0126073 A1 | 4/2021 | Xu et al. | | |

FOREIGN PATENT DOCUMENTS

| | | | |
|---|---|---|---|
| CN | 102998865 | A | 3/2013 |
| CN | 109585514 | A | 4/2019 |
| CN | 111106130 | A | 5/2020 |
| KR | 101466488 | B1 | 11/2014 |

\* cited by examiner

DISPLAY PANEL HAVING METAL LINES WITH DIFFERENT RESISTIVITIES AND DISPLAY DEVICE

FIELD OF INVENTION

The present disclosure relates to the field of display technology, and more particularly, to a display panel and a display device.

BACKGROUND OF INVENTION

Organic light-emitting diodes (OLEDs) are more and more widely used due to their advantages of light weight, self-illumination, wide viewing angles, low driving voltage, high luminous efficiency, low power consumption, and fast response times. In order to improve display uniformity of OLED panels, a second metal layer is made into a metal grid structure to connect to a VDD (drain voltage) signal. At present, a region wiring of a first fan-out region (fanout 1) and a second fan-out region (fanout 2) around a display region uses an alternating wiring of a first metal layer (GE1) and a second metal layer (GE2), wherein materials of the GE1/GE2 are equal, and a film thickness and a resistance are also equal. However, when the GE2 uses low-resistance materials, GE1/GE2 wiring resistance is quite different. The current alternating design will cause poor display.

SUMMARY OF INVENTION

In order to solve the above technical problems, the present disclosure provides a display panel and a display device which are configured to solve a technical problem in the prior art that a first metal layer and a second metal layer on both sides of a bonding region have different resistances and affect uniformity of the display panel.

Technical solutions solving the above technical problems are that the present disclosure provides a display panel comprising a first fan-out region, a bonding region disposed on a side of the first fan-out region, a second fan-out region disposed on a side of the bonding region away from the first fan-out region, a plurality of first metal lines disposed in the first fan-out region and the second fan-out region, a plurality of second metal lines disposed in the first fan-out region and the second fan-out region, wherein a resistivity of the second metal lines is less than a resistivity of the first metal lines, and a plurality of connecting lines, wherein one end of each of the connecting lines is connected to the first metal line, and the other end of each of the connecting lines is connected to the second metal lines.

Furthermore, the display panel comprises a display region disposed on a side of the first fan-out region away from the bonding region, a substrate disposed in the display region and extending to the second fan-out region, a barrier layer disposed on a surface on a side of the substrate and extending to the second fan-out region, a buffer layer disposed on a surface on a side of the barrier layer and extending to the second fan-out region, an active layer disposed on a surface on a side of the buffer layer away from the barrier layer and disposed in the display region, a first insulating layer disposed on a surface on a side of the buffer layer away from the barrier layer and extending to the second fan-out region, a first metal layer disposed on a surface on a side of the first insulating layer away from the buffer layer and disposed in the display region, a second insulating layer disposed on the surface on the side of the first insulating layer away from the buffer layer and extending to the second fan-out region, a second metal layer disposed on a surface on a side of the second insulating layer away from the first insulating layer and disposed in the display region, a dielectric layer disposed on the surface on the side of the second insulating layer away from the first insulating layer extending to the second fan-out region, a filling layer disposed in the bonding region and penetrating through the dielectric layer, the second insulating layer, the first insulating layer, the buffer layer, the barrier layer, and a portion of the substrate, and a source/drain electrode disposed in the display region, wherein one end of the source/drain electrode is disposed on a side of the dielectric layer away from the second insulating layer, and one end of the source/drain electrode penetrates the dielectric layer, the second insulating layer, and the first insulating layer, and is connected to the active layer.

Furthermore, the first metal lines are disposed on the surface on the side of the first insulating layer away from the buffer layer, the second metal lines are disposed on the surface on the side of the second insulating layer away from the first insulating layer, and the connecting lines are disposed on surfaces of the filling layer and the dielectric layer.

Furthermore, each of the connecting lines comprises two pins, one pin penetrates the dielectric layer to connect to the second metal line, and the other pin penetrates the dielectric layer to connect to the first metal line and the second insulating layer, wherein the two pins of each of the connecting lines are disposed on both sides of the filling layer.

Furthermore, the display panel comprises a planarization layer disposed on a surface on a side of the dielectric layer away from the second insulating layer and extending to the second fan-out region, an anode layer disposed in the display region, and on a surface on a side of the planarization layer away from the dielectric layer, and penetrates the planarization layer to connect to the source/drain electrode, and a pixel defining layer disposed on a surface of a side of the planarization layer away from the dielectric layer and corresponding to the anode layer.

Furthermore, a material of the second metal line comprises aluminum or aluminum alloy material.

Furthermore, a material of the first metal lines comprises a molybdenum metal material.

Furthermore, a resistivity ratio of a resistivity of the first metal line to a resistivity of the second metal line is greater than 1.

Furthermore, a material of the filling layer comprises organic materials.

The present disclosure further provides a display device comprising the display panel.

Beneficial effects of the present disclosure are that the materials of the first metal layer and the second metal layer in the display panel and the display device of the present disclosure are different, so that the resistivity of the second metal layer is less than the resistivity of the first metal layer, wherein the second metal layer uses a grid structure, which effectively improves uniformity of the display panel. The two ends of the connecting line of the bonding region are respectively connected to the first metal layer and the second metal layer, reducing a difference in resistance of any two connecting lines, improving current stability, and improving display quality of the display panel.

DESCRIPTION OF DRAWINGS

Following describes specific embodiments of the present disclosure in detail with reference to accompanying drawings, which will make the technical solutions and other beneficial effects of the present disclosure obvious.

Figure 1:
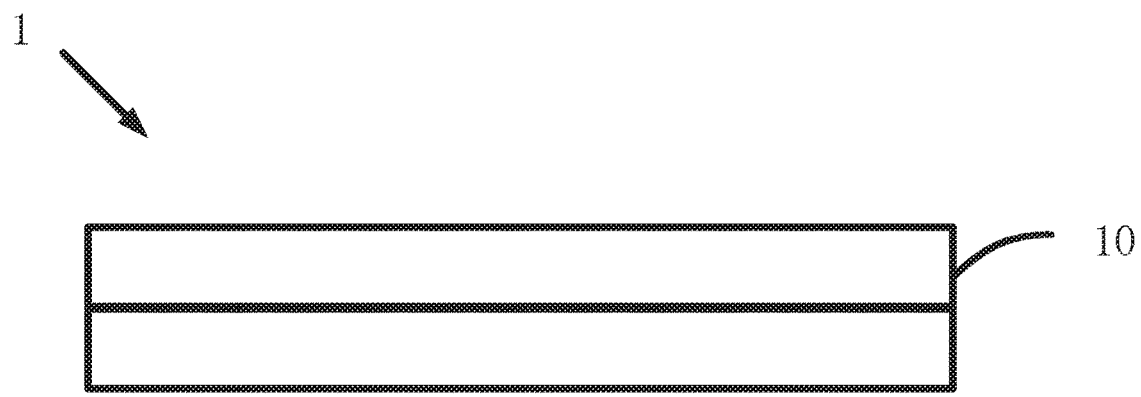
FIG. 1 is a schematic diagram of a display device in an embodiment.

Figure numerals: display device 1, display panel 10, display region 101, first fan-out region 102, bonding region 103, second fan-out region 104, substrate 1101, barrier layer 1102, buffer layer 1103, active layer 1104, first insulating layer 1105, first metal layer 1106, second insulating layer 1107, second metal layer 1108, dielectric layer 1109, filling layer 1110, source/drain electrode 1111, planarization layer 1112, anode layer 1113, pixel defining layer 1114.

DETAILED DESCRIPTION OF PREFERRED EMBODIMENTS

The technical solutions in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

In the present disclosure, unless explicitly stated and defined otherwise, the first feature may be "above" or "below" the second feature and may include direct contact between the first and second features. It may also include that the first and second features are not in direct contact but are contacted by another feature between them. Moreover, the first feature is "above" the second feature, including the first feature directly above and obliquely above the second feature, or merely indicates that the first feature is higher in level than the second feature. The first feature is "below" the second feature, including the first feature is directly below and obliquely below the second feature, or only indicates that the first feature is less horizontal than the second feature.

The following disclosure provides many different embodiments or examples for achieving different structures of the present disclosure. To simplify the present disclosure, components and settings of specific examples are described below. They are only examples and are not intended to limit the present disclosure. In addition, the present disclosure may repeat reference numbers and/or reference letters in different examples, this repetition is for the purpose of simplicity and clarity, and does not itself indicate the relationship between various embodiments and/or settings discussed. In addition, the present disclosure provides examples of various specific processes and materials, but those of ordinary skill in the art may be aware of the present disclosure of other processes and/or the use of other materials.

Embodiment

Figure 2:
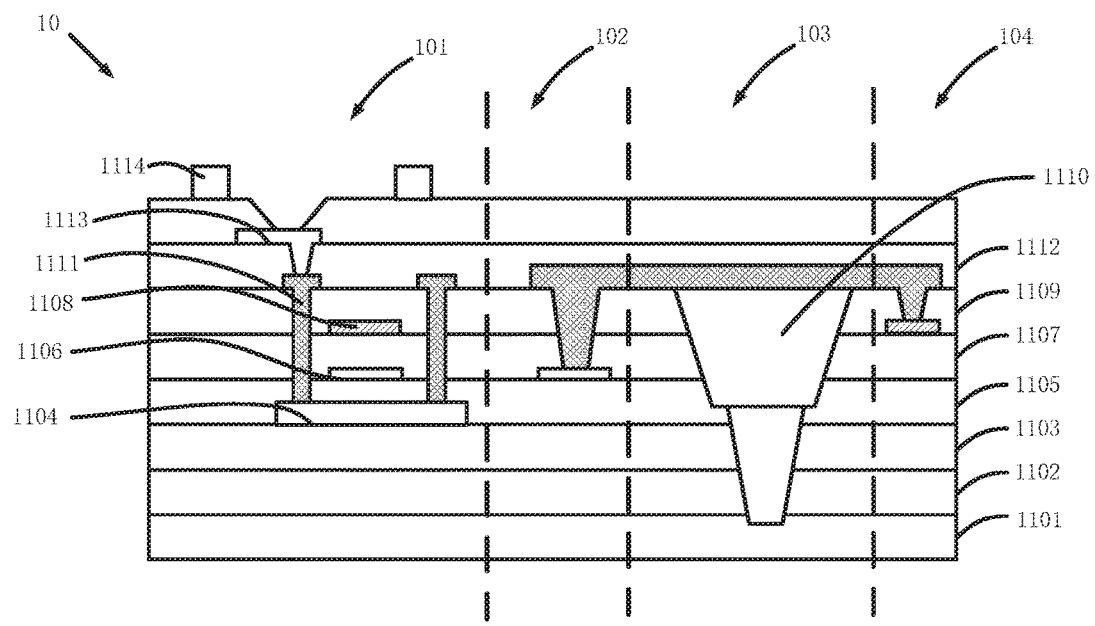
FIG. 2 is a schematic structural diagram of a display panel in the embodiment.

As shown in FIG. 1 and FIG. 2, FIG. 1 is a schematic diagram of a display device in an embodiment. FIG. 2 is a schematic structural diagram of a display panel in the embodiment. In the present embodiment, a display device of the present disclosure comprises a display panel 10, wherein the display panel comprises a display region 101, a first fan-out region 102, a bonding region 103, and a second fan-out region 104.

The first fan-out region 102 is disposed between the display region 101 and the bonding region 103, the second fan-out region is disposed on a side of the bonding region 103 away from the first fan-out region 102, wherein the display panel 10 further comprises a substrate 1101, a barrier layer 1102, a buffer layer 1103, an active layer 1104, a first insulating layer 1105, a first metal layer 1106, a second insulating layer 1107, a second metal layer 1108, a dielectric layer 1109, a filling layer 1110, a source/drain electrode 1111, a planarization layer 1112, an anode layer 1113, a pixel defining layer 1114.

The substrate 1101 is a hard substrate, generally a glass substrate, and is configured as a support and a substrate.

The barrier 1102 is disposed on an upper surface of the substrate 1101, and is configured to block external water and oxygen. A material of the barrier layer 1102 is an inorganic material, and the inorganic material comprises silicon oxide, silicon nitride, or a multilayer structure. The inorganic materials have good water and oxygen barrier capabilities, which can effectively prevent external moisture from entering the display panel 10 through the barrier layer. A multilayer inorganic film material of the barrier layer 1102 is silicon oxide and silicon nitride, which can be manufactured by vapor deposition. A thickness of the barrier layer 1102 ranges from 1000 Å to 5000 Å.

The buffer layer 1103 is disposed on an upper surface of the barrier layer 1102, and is configured as a buffer. Specifically, a material of the buffer layer 1103 comprises silicon oxide or silicon nitride, or multilayer structure. A thickness of the buffer layer 1103 ranges from 1000 Å to 5000 Å.

The active layer 1104 is disposed on an upper surface of the buffer layer 1103, a material of the active layer 1104 is a semiconductor material, and the semiconductor material comprises indium gallium zinc oxide (IGZO), indium gallium titanium oxide (IZTO), and indium gallium zinc titanium oxide (IGZTO). A thickness of the active layer 1104 ranges from 100 Å to 1000 Å. The active layer 1104 provides circuit support for the display panel.

The first insulating layer 1105 is disposed on a surface on a side of the barrier layer 1102 away from the buffer layer 1103 and covers the active layer 1104. A material of the first insulating layer 1105 is inorganic, and the inorganic material comprises silicon oxide or silicon nitride, or a multilayer thin film structure. A thickness of the first insulating layer 1105 ranges from 1000 Å to 3000 Å.

The first metal layer 1106 is disposed on a surface of the first insulating layer. A material of the first metal layer 1106 is a metal material, and the metal material comprises molybdenum (Mo), aluminum (Al), copper (Cu), titanium (Ti), etc., or an alloy, or a multilayer thin film structure. A thickness of the first metal layer 1106 ranges from 2000 Å to 8000 Å.

The second insulating layer 1107 is disposed on a surface on a side of the first insulating layer 1105 away from 1102 and covers the first metal layer 1106. A material of the second insulating layer 1107 is an inorganic material, and the inorganic material comprises silicon oxide or silicon nitride, or a multilayer thin film structure. A thickness of the second insulating layer 1107 ranges from 1000 Å to 3000 Å. The second insulating layer 1107 covers the first metal layer 1106, which is configured as an insulation to prevent short circuits between lines inside the display panel.

The second metal layer 1108 is disposed on a surface on a side of the second insulating layer 1107 away from the first insulating layer 1105. A material of the second metal layer 1108 is a metal material, and the metal material comprises molybdenum (Mo), aluminum (Al), copper (Cu), titanium (Ti), etc., or an alloy, or a multilayer thin film structure, wherein the second metal layer 1108 uses a grid structure. A thickness of the second metal layer 1108 ranges from 2000 Å to 8000 Å.

The dielectric layer 1109 is disposed on a surface on a side of the second insulating layer 1107 away from the first insulating layer 1105 and covers the second metal layer 1108. The dielectric layer 1109 is an interlayer insulating layer, and a material of the dielectric layer 1109 is an inorganic material, the inorganic material comprises silicon oxide or silicon nitride, or a multilayer thin film structure, which is configured as an insulation to prevent short circuits of circuits. A thickness of the dielectric layer 1109 ranges from 2000 Å to 10000 Å. A through-hole is defined above the active layer 1104, the through-hole facilitates electrical connection between the source/drain electrode 1111 and the active layer 1104.

The source/drain electrode 1111 is disposed on an upper surface of the dielectric layer 1109. A material of the source/drain electrode 1111 comprises a metal material, and the metal material comprises molybdenum (Mo), aluminum (Al), copper (Cu), titanium (Ti), etc., or an alloy, or a multilayer thin film structure, A portion of the metal material is provided in the through-hole, and the source/drain electrode 1111 is electrically connected to the active layer 1104 through the through-hole to form a circuit conduction. A thickness of the source/drain electrode 1111 ranges from 2000 Å to 8000 Å.

The planarization layer 1112 is disposed on a surface on a side of the dielectric layer 1109 away from the second insulating layer 1107. The planarization layer 1112 can make surfaces of film layers smooth, which facilitates bonding of subsequent film layers and prevents a phenomenon of detachment. A first through-hole is defined on the planarization layer 1112, and corresponds to the source/drain electrode 1111 to provide a channel for connecting the anode layer 1113 and the source/drain electrode 1111.

The pixel defining layer 1114 is disposed on a surface on a side of the planarization layer 1112 away from the dielectric layer 1109, A second through-hole is defined at the pixel defining layer 1114 corresponding to the first through-hole to provide a channel for connecting the anode layer 1113 and the source/drain electrode 1111.

The anode layer 1113 is disposed in the first through-hole and the second through-hole. A material of the anode layer 1113 is an indium tin oxide material that fills the first through-hole and a portion of the second through-hole. The anode layer 1113 is electrically connected to the source/drain layer 1111 to provide a circuit support for subsequent light emitting material to emit light.

Wherein, the active layer 1108 is disposed in the display region 101, the first metal layer 1106 is disposed in the display region 101 the first fan-out region 102, and the second fan-out region 104, the second metal layer 1108 is disposed in the display region 101 the first fan-out region 102, and the second fan-out region 104, and the source/drain electrode 1111 is disposed in the display region 101 and the bonding region 103.

Figure 3:
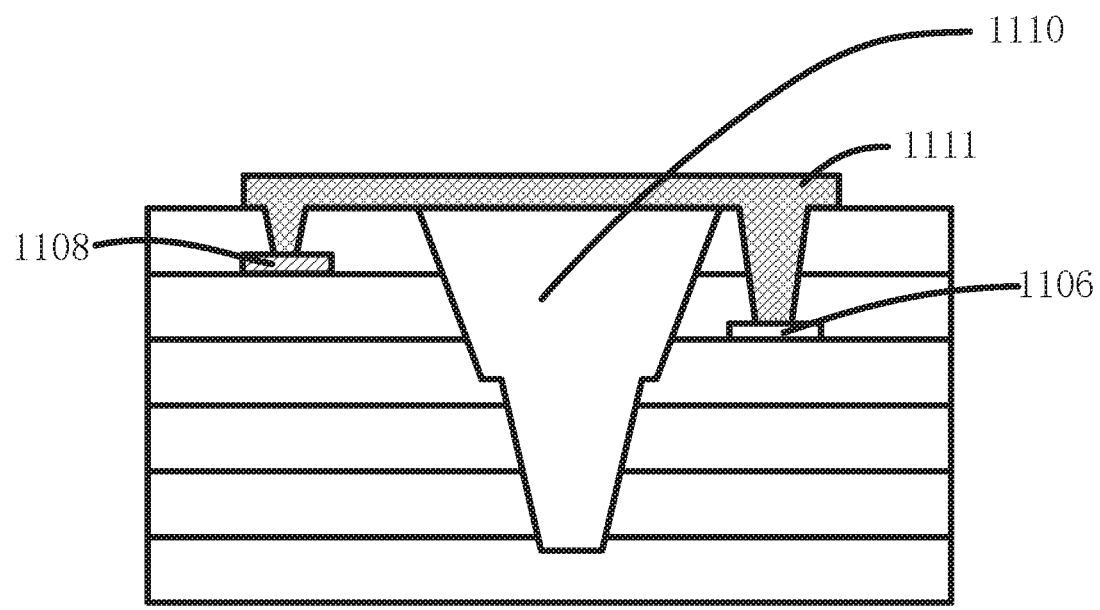
FIG. 3 is a schematic partial diagram of the display panel in the embodiment.

In the present embodiment, the first metal layer 1106 and the second metal layer 1108 in the first fan-out region 102 are not oppositely arranged, that is, a projection of the first metal layer 1106 on the substrate 1101 does not coincide with a projection of the second metal layer 1108 on the substrate 1101, and the first metal layer 1106 and the second metal layer 1108 in the second fan-out region 104 are also not oppositely arranged, which facilitates connection of the source/drain electrode 1111 in the bonding region 103 with the first metal layer 1106 and the second metal layer 1108. As shown in FIG. 3, FIG. 3 is a schematic partial diagram of the display panel in the embodiment. In other preferred embodiments of the present disclosure, the first metal layer 1106 and the second metal layer 1108 can also be arranged oppositely, and only a direction of pins of the source/drain electrode 1111 in the bonding region 103 can be changed.

In order to improve display uniformity of the display panel 10, in the present embodiment, the second metal layer 1108 uses a grid structure, and selects a low-resistance material, such as aluminum or aluminum alloy, etc.

Figure 4:
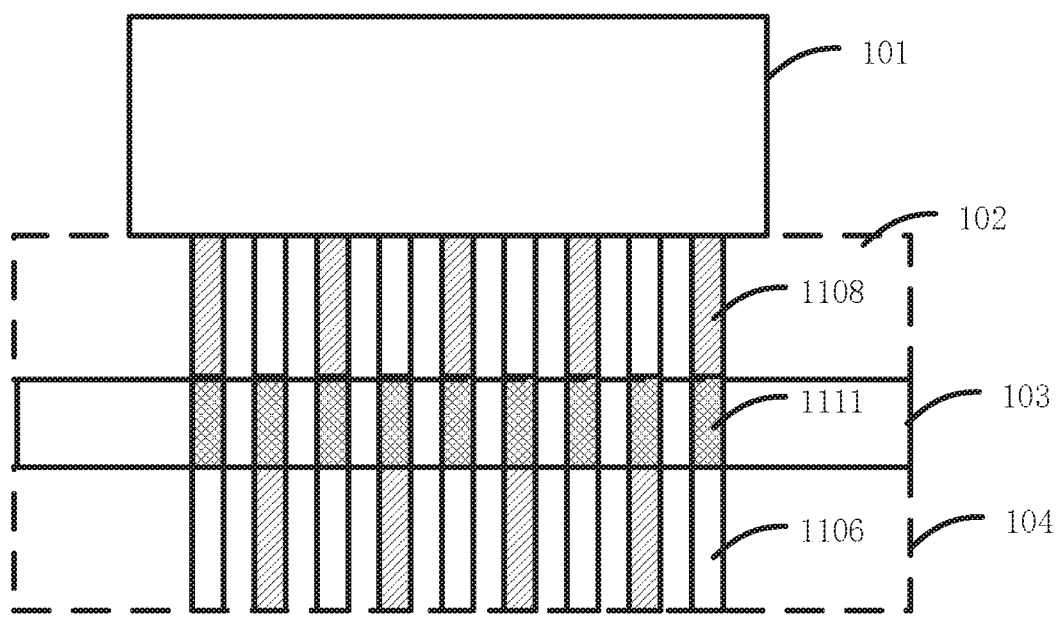
FIG. 4 is a partial top view of the display panel in the embodiment.

The filling layer 1110 is disposed in the bonding region 103. The bonding region is provided with a through-hole, and the through-hole penetrates the dielectric layer 1109, the second insulating layer 1107, the first insulating layer 1105, the buffer layer 1103, and the barrier layer 1102 in the bonding region 103. The filling layer 1110 is an inorganic material, one side of the filling layer 1110 is flush with the side of the dielectric layer 1109 away from the second insulating layer 1107, and the source/drain electrode 1111 disposed in the bonding region 103 is disposed on the filling layer 1110. In the present embodiment, the source/drain electrode 1111 disposed on the filling layer 1110 is defined as a connecting line, one end is connected to the first metal layer 1106 or the second metal layer 1108 in the first fan-out region 102, and the other end of each of the connecting lines is connected to the first metal layer 1106 or the second metal layer 1108 in the second fan-out region 104. As shown in FIG. 4, FIG. 4 is a partial top view of the display panel in the embodiment. In the present embodiment, in order to ensure that a sum of resistance values at both ends of each of the connecting lines is equal, metal layers connected at both ends of each of the connecting lines are different, that is, one end of each of the connecting lines is connected to the first metal layer 1106, and the other end of each of the connecting lines is connected to the second metal layer 1108. Since the first metal layer 1106 and the second metal layer 1108 are respectively disposed on the first insulating layer 1105 and the second insulating layer 1107, the connecting line comprises two pins, one pin penetrates the dielectric layer 1109 to connect to the second metal layer 1108, and the other pin penetrates the dielectric layer 1109 and the second insulating layer 1107 to connect to the first metal layer 1106. Using connecting lines to connect the metal layers with different resistance values can realize uniformity of resistance of metal lines, thereby improving display quality of the display panel 10.

Beneficial effects of the present disclosure are that the materials of the first metal layer and the second metal layer in the display panel and the display device of the present embodiment are different; so that the resistivity of the second metal layer is less than the resistivity of the first metal layer, wherein the second metal layer uses a grid structure, which effectively improves the uniformity of the display panel. The two ends of the connecting line of the bonding region are respectively connected to the first metal layer and the second metal layer, reducing a difference in resistance of adjacent two connecting lines, and improving the display quality of the display panel.

In the above embodiments, the description of each embodiment has its own emphasis. For a part that is not detailed in an embodiment, referring to the related descriptions of other embodiments.

The embodiments of the present disclosure have been described in detail above. The present disclosure uses specific examples to describe principles and embodiments of the present disclosure. The descriptions of the above embodiments are only used to help understand technical solutions of the present disclosure and core ideas thereof. Moreover, those of ordinary skill in the art should understand that the technical solutions described in the aforesaid embodiments can still be modified, or have some technical features equivalently replaced. However, these modifications or replacements do not depart from a scope of the technical solutions of the embodiments of the present disclosure.

What is claimed is:

1. A display panel, comprising:
   a first fan-out region;
   a bonding region disposed on a side of the first fan-out region;
   a second fan-out region disposed on a side of the bonding region away from the first fan-out region;
   a plurality of first metal lines disposed in the first fan-out region and the second fan-out region;
   a plurality of second metal lines disposed in the first fan-out region and the second fan-out region, wherein a resistivity of each of the second metal lines is less than a resistivity of each of the first metal lines;
   a plurality of connecting lines, wherein an end of each of the connecting lines is connected to one of the first metal lines, and an other end of each of the connecting lines is connected to one of the second metal lines;
   a display region disposed on a side of the first fan-out region away from the bonding region;
   a substrate, disposed in the display region and extending to the second fan-out region;
   a barrier layer, disposed on a surface of the substrate and extending to the second fan-out region;
   a buffer layer, disposed on a surface of the barrier layer and extending to the second fan-out region;
   an active layer, disposed on a surface of the buffer layer away from the barrier layer and disposed in the display region;
   a first insulating layer, disposed on a surface of the buffer layer away from the barrier layer and extending to the second fan-out region;
   a first metal layer, disposed on a surface of the first insulating layer away from the buffer layer and disposed in the display region;
   a second insulating layer, disposed on the surface of the first insulating layer away from the buffer layer and extending to the second fan-out region;
   a second metal layer, disposed on a surface of the second insulating layer away from the first insulating layer and disposed in the display region;
   a dielectric layer disposed on the surface of the second insulating layer away from the first insulating layer and extending to the second fan-out region;
   a filling layer disposed in the bonding region and penetrating through the dielectric layer, the second insulating layer, the first insulating layer, the buffer layer, the barrier layer, and a portion of the substrate; and
   a source/drain electrode disposed in the display region, wherein one end of the source/drain electrode is disposed on a surface of the dielectric layer away from the second insulating layer, and another end of the source/drain electrode penetrates the dielectric layer, the second insulating layer, and the first insulating layer, and is connected to the active layer,
   wherein the first metal lines are disposed on the surface of the first insulating layer away from the buffer layer;
   the second metal lines are disposed on the surface of the second insulating layer away from the first insulating layer; and
   each of the connecting lines comprises a trunk and two pins extending from the trunk, the trunk comprises a part disposed on the surface of the dielectric layer away from the second insulating layer and another part disposed on a surface of the filling layer, and the surface of the dielectric layer away from the second insulating layer is flush with the surface of the filling layer.

2. The display panel as claimed in claim 1, wherein one of the two pins penetrates the dielectric layer to connect to one of the second metal lines, another one of the two pins penetrates the dielectric layer and the second insulating layer to connect to one of the first metal lines, and the two pins are disposed on both sides of the filling layer, respectively.

3. The display panel as claimed in claim 1, wherein the display panel comprises:
   a planarization layer disposed on the surface of the dielectric layer away from the second insulating layer and extending to the second fan-out region;
   an anode layer disposed in the display region, and on a surface of the planarization layer away from the dielectric layer, and penetrating the planarization layer to connect to the source/drain electrode;
   a pixel defining layer disposed on the surface of the planarization layer away from the dielectric layer and extending to the second fan-out region; and
   a pixel hole provided on the pixel defining layer and opposite to the anode layer.

4. The display panel as claimed in claim 1, wherein a material of each of the second metal lines comprises an aluminum or aluminum alloy material.

5. The display panel as claimed in claim 1, wherein a material of each of the first metal lines comprises a molybdenum metal material.

6. The display panel as claimed in claim 1, wherein a ratio of the resistivity of each of the first metal lines to the resistivity of each of the second metal lines is greater than 1.

7. The display panel as claimed in claim 1, wherein a material of the filling layer comprises an organic material.

8. A display device, comprising the display panel as claimed in claim 1.

* * * * *